United States Patent
Lubeley et al.

(10) Patent No.: US 10,224,930 B2
(45) Date of Patent: Mar. 5, 2019

(54) METHOD FOR DETECTING THE TOPOLOGY OF ELECTRICAL WIRING

(71) Applicant: dSPACE digital signal processing and control engineering GmbH, Paderborn (DE)

(72) Inventors: Dominik Lubeley, Verl (DE); Marc Schlenger, Paderborn (DE); Heiko Kalte, Paderborn (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 0 days.

(21) Appl. No.: 15/964,245

(22) Filed: Apr. 27, 2018

(65) Prior Publication Data
US 2018/0323784 A1   Nov. 8, 2018

(30) Foreign Application Priority Data
May 5, 2017   (EP) .................................. 17169690

(51) Int. Cl.
| | |
|---|---|
| *H03K 19/003* | (2006.01) |
| *H03K 19/017* | (2006.01) |
| *G01R 31/317* | (2006.01) |
| *H03K 19/0175* | (2006.01) |

(52) U.S. Cl.
CPC ..... *H03K 19/003* (2013.01); *G01R 31/31717* (2013.01); *H03K 19/017509* (2013.01); *H03K 19/017581* (2013.01)

(58) Field of Classification Search
CPC ......... H03K 19/003; H03K 19/017509; H03K 19/017581; G01R 31/31717

USPC .......................................................... 326/16
See application file for complete search history.

(56) References Cited

U.S. PATENT DOCUMENTS

| | | | | |
|---|---|---|---|---|
| 5,596,742 A | * | 1/1997 | Agarwal | G06F 17/5027 326/37 |
| 5,761,484 A | * | 6/1998 | Agarwal | G06F 17/5027 326/38 |
| 7,353,162 B2 | * | 4/2008 | Huang | G06F 17/5027 703/17 |

(Continued)

FOREIGN PATENT DOCUMENTS

WO   WO 03005212 A1   1/2003

OTHER PUBLICATIONS

DS5203 FPGA Board: FPGA programmable per application, Modular Hardware, Dec. 2017, pp. 450-453.

*Primary Examiner* — Daniel D Chang
(74) *Attorney, Agent, or Firm* — Leydig, Voit & Mayer, Ltd.

(57) ABSTRACT

A method for detecting the topology of electrical wiring between at least two field-programmable gate arrays (FPGAs) includes implementing a first receive register on a second interface pin; implementing a first send register on a first driver; activating the first driver via a first activation signal; emitting, by the first driver, a first signal, wherein the first signal is defined by the first send register; reading out, by a first receive register, whether the first signal is received at the second interface pin; and allocating the second interface pin to the first interface pin if the first signal from the first driver is received at the second interface pin.

14 Claims, 8 Drawing Sheets

110: implement receive register

120: implement send register

130: set send register

140: set activation signal

150: read out receive register

160: allocate interface pins to one another

170: store or output allocation

(56) References Cited

U.S. PATENT DOCUMENTS

2006/0215573 A1 9/2006 Terry
2016/0161551 A1 6/2016 Tuna et al.

* cited by examiner 13 driver
16 activation signal
17 signal
60 read driver
61 logical value
70 write driver
71 applied logical signal 1 FPGA
2 FPGA
3 interface pin
4 interface pin
5 interface pin
6 interface pin
7 interface pin
8 interface pin
9 interface pin
10 interface pin
11 line
12 line 13 driver
14 receive register
16 activation signal
17 signal
60 read driver
61 logical value
70 write driver
71 applied logical signal 13 driver
15 send register
16 activation signal
17 signal
60 read driver
61 logical value
70 write driver
71 applied logical signal 110: implement receive register 120: implement send register 130: set send register 140: set activation signal 150: read out receive register 160: allocate interface pins to one another 170: store or output allocation

Fig 5

13 driver
15 send register
16 activation signal
17 signal
20 activation register
60 read driver
61 logical value
70 write driver
71 applied logical signal 13 driver
14 receive register
15 send register
16 activation signal
17 signal
20 activation register
30 FPGA program
40 send multiplexer
41 receive multiplexer
42 constant
60 read driver
61 logical value
70 write driver
71 applied logical signal 1 FPGA
2 FPGA
3 interface pin
4 interface pin
5 interface pin
6 interface pin
7 interface pin
8 interface pin
9 interface pin
10 interface pin
11 line
12 line 50 interface pin
51 interface pin
52 interface pin
80 FPGA
81 line
82 line

METHOD FOR DETECTING THE TOPOLOGY OF ELECTRICAL WIRING

CROSS-REFERENCE TO RELATED APPLICATIONS

Priority is claimed to European Patent Application No. EP 17169690.9, filed on May 5, 2017, the entire disclosure of which is hereby incorporated by reference herein.

FIELD

The invention relates to a method for detecting the topology of electrical wiring between at least two field-programmable gate arrays (FPGAs).

BACKGROUND

Inter-FPGA communication via a 32-bit bus is known from page 451, the part relating to DS5203, of the 2017 product catalog for dSPACE.

A disadvantage of the prior art is the great degree of complexity involved in testing whether the lines required for communication are correctly wired and intact. Incorrect wiring can lead to communication errors or the destruction of the FPGAs.

SUMMARY

In an exemplary embodiment, the present invention provides a method for detecting the topology of electrical wiring between at least two field-programmable gate arrays (FPGAs). A first FPGA comprises a plurality of interface pins including a first interface pin. A second FPGA comprises a plurality of interface pins including a second interface pin. A plurality of lines connect at least some of the interface pins of the first FPGA to at least some of the interface pins of the second FPGA. A first driver is provided on the first interface pin. The method includes: implementing a first receive register on the second interface pin; implementing a first send register on the first driver; activating the first driver via a first activation signal; emitting, by the first driver, a first signal, wherein the first signal is defined by the first send register; reading out, by the first receive register, whether the first signal is received at the second interface pin; and allocating the second interface pin to the first interface pin if the first signal from the first driver is received at the second interface pin.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 5 is a schematic view of the method steps of a method according to the invention;

DETAILED DESCRIPTION

The invention relates to a method for detecting the topology of electrical wiring between at least two FPGAs, a first FPGA comprising a plurality of interface pins including a first interface pin, a second FPGA comprising a plurality of interface pins including a second interface pin, a plurality of lines connecting at least some of the interface pins of the first FPGA to at least some of the interface pins of the second FPGA, a first driver being provided on the first interface pin, a first receive register being implemented on the second interface pin, a first send register being implemented on the first driver, the signal issued by the first driver being defined by the send register, the first driver being activated via a first activation signal, the first driver emitting a first signal, the first receive register reading out whether the first signal is received at the second interface pin, and the second interface pin being allocated to the first interface pin if the signal from the first driver is received at the second interface pin.

It should be noted that the method can also be carried out several times for connections between different pins of the two FPGAs. Likewise, said method can also be carried out between one or more pins of the first FPGA and one or more pins of a third FPGA. The signal from the first driver can be received at a plurality of interface pins, in which case all the interface pins at which the signal from the first driver is received are allocated to the first interface pin.

Figure 1:
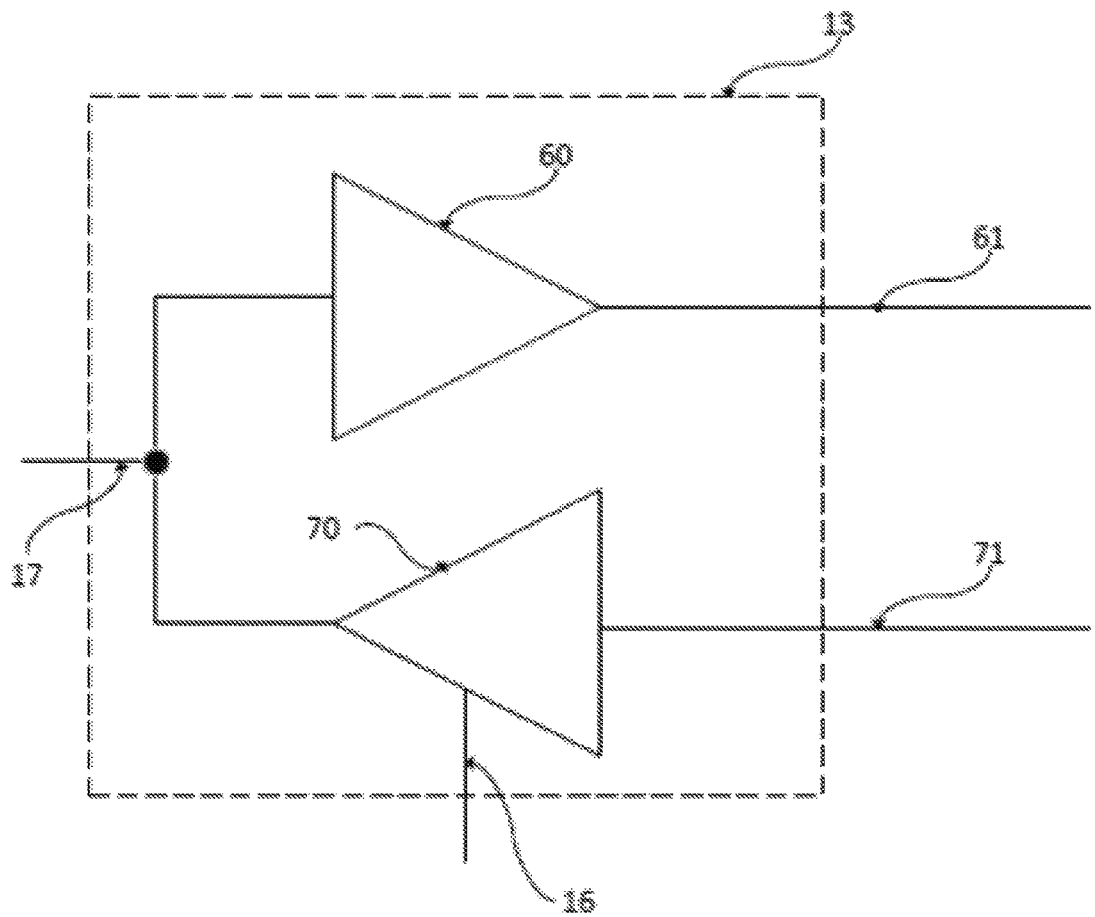
FIG. 1 is a schematic view of an input/output (IO) driver of an FPGA.

In an FPGA, one IO driver is typically provided for each interface pin. Such an IO driver is shown in FIG. 1 and will be described in more detail below.

According to the invention, the output of the read driver provided on the second interface pin is connected to the input of the first receive register. According to the invention, the output of the first send register is connected to the input signal from the write driver of the first driver.

The allocation of the second interface pin to the first interface pin can be stored or can be directly issued to the user. Said allocation can be stored in the form of a table, a database or another type of file or information structure, for example. An output can be in the form of a graphic or textual monitor display or in the form of a printout or hard copy.

One advantage of the method according to the invention is that the allocation makes it directly apparent that a working connection has been established between the first interface pin and the second interface pin. Manual testing is therefore not required. A test is carried out to check whether a connection has been established between the first interface pin and the second interface pin and whether the connection is working correctly. As a result, damage to the connection that is not visible to the naked eye can also be detected.

The first signal can also be a sequence of signal values. By testing whether a known sequence of signal values is correctly transmitted via the connection, random equality between the signal that is issued and the signal that is received can be prevented.

In one embodiment, a first activation register is implemented on the first driver, the first activation register transmitting the first activation signal to the driver.

In this embodiment, the activation signal is not directly transmitted to the driver, but is temporarily stored in the activation register.

In an alternative embodiment, the activation signal is directly transmitted to the driver via a control body.

In an advantageous embodiment, the registers are addressed via a control body.

The control body can be implemented on one of the FPGAs and can be an additional unit. The control body can be implemented on the first FPGA and/or the second FPGA in the form of a processor kernel, for example. The control body can, however, also be a computer connected to the first and second FPGAs. The registers can be addressed by the control body via an address bus, for example. Alternatively, the registers can, however, also be directly connected to the control body or indirectly connected to the control body via multiplexers, for example.

In another embodiment, information regarding the fact that the first interface pin is intended to be connected to the second interface pin is known, a warning being issued if the first signal is not received at the second interface pin.

One advantage of this embodiment is that the user does not have to manually test the allocation between the interface pins. The information can originate from a modeling tool, for example, in which the communication between the first FPGA and the second FPGA is defined. In the same way as the allocation, issuing of the warning can be stored or directly issued to the user.

Information can of course be provided for a plurality of connections between different interface pins. In this case, each connection is tested individually and a warning is issued at least for one faulty connection, preferably for every faulty connection.

In an exemplary embodiment, a plurality of activation signals are implemented for one driver in each case, each of the activation signals individually activating a driver and all the interface pins at which the signal from the driver, which is active in each case, is received being allocated to the interface pin of the active driver.

It is advantageous for it to be possible to test a plurality of connections without an FPGA having to be reconfigured between tests.

In one embodiment, it is preferable for first information relating to a first FPGA program to be known, the first information determining for which interface pins of the first FPGA activation signals, send registers and/or receive registers are implemented.

In this way, the connections to the interface pins, via which the first FPGA program is intended to communicate, can be tested. An activation signal and send register are implemented on interface pins used by the first FPGA program to send information. Receive registers are implemented on interface pins used by the first FPGA program to obtain information.

In one exemplary embodiment, the first FPGA program is implemented, together with the first send register, on the first FPGA, a first send multiplexer being implemented on the first FPGA, the first send multiplexer connecting the first driver to the first send register and to the first FPGA program, the first send multiplexer controlling whether the first send register or the first FPGA program defines the signal to be issued by the first driver.

The send multiplexer thus either connects the first send register to the input signal from the write driver of the first driver or connects the first FPGA program to the input signal from the write driver of the first driver. The first send register is preferably connected to the driver first, then the connection between the first interface pin and the second interface pin is tested and then the first FPGA program is connected to the first interface pin. In this way, the connection is tested before the first FPGA program uses a potentially faulty connection. By implementing both the send register and the FPGA program, the FPGA program can be used after the test procedure without the FPGA having to be reconfigured after the test procedure. This saves time and ensures that the connections to precisely those connections that are also used by the first FPGA program are tested.

The send multiplexer can be controlled by the control body. The control signal can be directly conducted to the send multiplexer or a register can be implemented in the FPGA, the value of the register defining the circuit of the send multiplexer and the value of the register being written into the register by the control body. According to another exemplary embodiment, second information relating to a second FPGA program is known, the second information determining for which interface pins of the second FPGA activation signals, send registers and/or receive registers are implemented.

In this way, the connections to the interface pins via which the second FPGA program is intended to communicate can be tested. The activation signal and the send register are implemented on interface pins that the second FPGA program intends to use in order to send information. Receive registers are implemented on interface pins that the second FPGA program intends to use in order to obtain information.

In an exemplary embodiment, the second FPGA program is implemented, together with a second send register, on the second FPGA, a second send multiplexer being implemented on the second FPGA, the second send multiplexer connecting a second driver to the second send register and to the second FPGA program, the second send multiplexer controlling whether the second send register or the second FPGA program defines the signal to be issued by the second driver.

In this case, the second send register is preferably implemented for a different interface pin to the first receive register. The interface pin is connected to an additional interface pin on an FPGA, on which a receive register can, in turn, be implemented, via a second line. This makes it possible to test a connection via which the second FPGA program intends to emit signals.

The write driver of the second driver can be activated via an activation signal. The first driver and the second driver are preferably not activated at the same time. This prevents the drivers from driving against one another if they are connected to the same connection.

In an exemplary embodiment, the second FPGA program is implemented, together with the first receive register, on the first FPGA, a first receive multiplexer being implemented on the second FPGA, the first receive multiplexer connecting the second FPGA program to the driver and to a constant, the first receive multiplexer controlling whether the second FPGA program receives the output from the driver or the value of the constant.

The second FPGA program can thereby be kept in a controlled state, irrespective of the signals used to test the connection.

In another embodiment, a second receive register is implemented on a third interface pin, the second receive register reading out whether the first signal is received at the third interface pin, the third interface pin being allocated to the first interface pin if the first signal is received at the third interface pin.

This therefore makes it possible for both the second interface pin and the third interface pin to be allocated to the first interface pin. Point-to-multipoint connections can therefore be tested. These allocations can also be compared with information relating to FPGA programs once again, and it is therefore possible to establish whether the desired connections are working properly.

In another embodiment, a second activation signal is implemented on the second interface pin, a warning being issued if the first signal is received at the second interface pin.

Only one transmitting driver is ever allowed to be active on one line; otherwise, there is a risk of short-circuiting if a plurality of drivers drive against one another. However, if a plurality of activation signals are implemented on interface pins that are interconnected via one connection, a warning is issued. This allows the user to change the connection or to implement the activation signals on other interface pins. If the first activation signal is implemented on the first interface pin on the basis of information relating to the first FPGA program and if the second activation signal is implemented on the second interface pin on the basis of information relating to the second FPGA program, the two programs are not likely to be compatible with one another or the connection is likely to be faulty. The warning allows the user to react to the incompatibility or faulty connection.

In another embodiment, an activation signal, a send register and a receive register are implemented on all the interface pins.

The activation signals and registers provided on all the interface pins make it possible to test all the connections between all the interface pins.

In an exemplary embodiment, the entire wiring topology is determined.

The electrical wiring topology is determined by each transmission driver being activated individually via the particular activation signal and all the interface pins at which the issued signal is received being allocated to the interface pin of the transmission driver, which is active in each case. The electrical wiring topology can then be used to determine the interface pins used for communication by the FPGA programs that are intended to run on the particular FPGAs.

In one embodiment, one activation register is implemented for each activation signal.

The activation register then contains the activation signal. The activation signal can be activated and deactivated simply by setting the register.

FIG. 1 shows a known IO driver provided in an FPGA. An IO driver 13 includes a read driver 60 and a write driver 70. The read driver 60 is active at all times. The read driver 60 evaluates the signal 17 applied to the interface pin and makes the logical value 61 available to the functions in the FPGA. The write driver 70 can be activated via an activation signal 16. If the write driver 70 is active, it transforms an applied logical signal 71 into a fixed voltage, which it issues via the interface pin. An input signal from the write driver is used to define which signal 17 the write driver issues via the interface pin.

Figure 2:
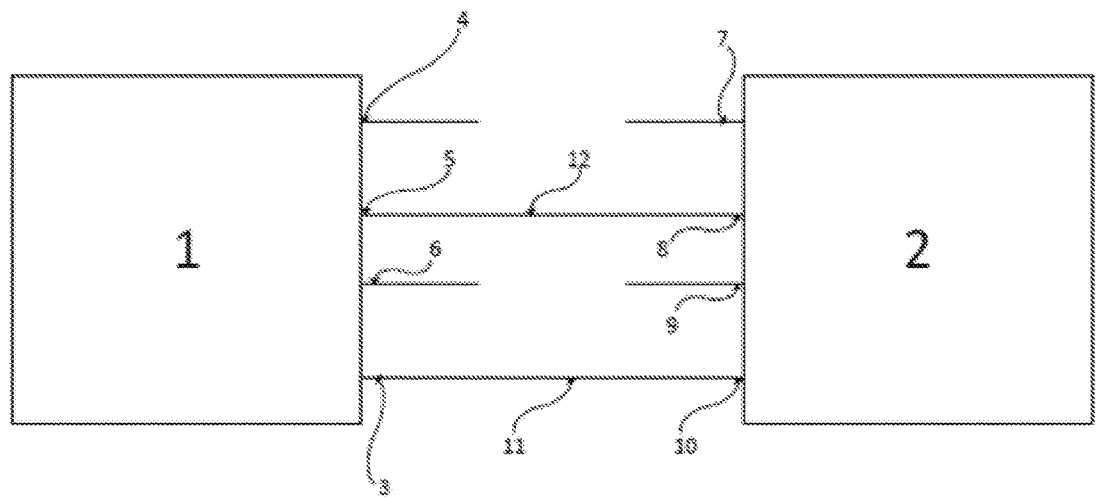
FIG. 2 is a schematic view of two FPGAs, which are interconnected via a plurality of lines.

FIG. 2 shows a first FPGA 1 comprising a first interface pin 5 and a second FPGA 2 comprising a second interface pin 8. A plurality of lines 11, 12 connect some of the interface pins 3, 4, 5, 6 of the first FPGA 1 to some of the interface pins 7, 8, 9, 10 of the second FPGA 2. In this case, a first line 12 connects the first interface pin 5 to the second interface pin 8.

Figure 3:
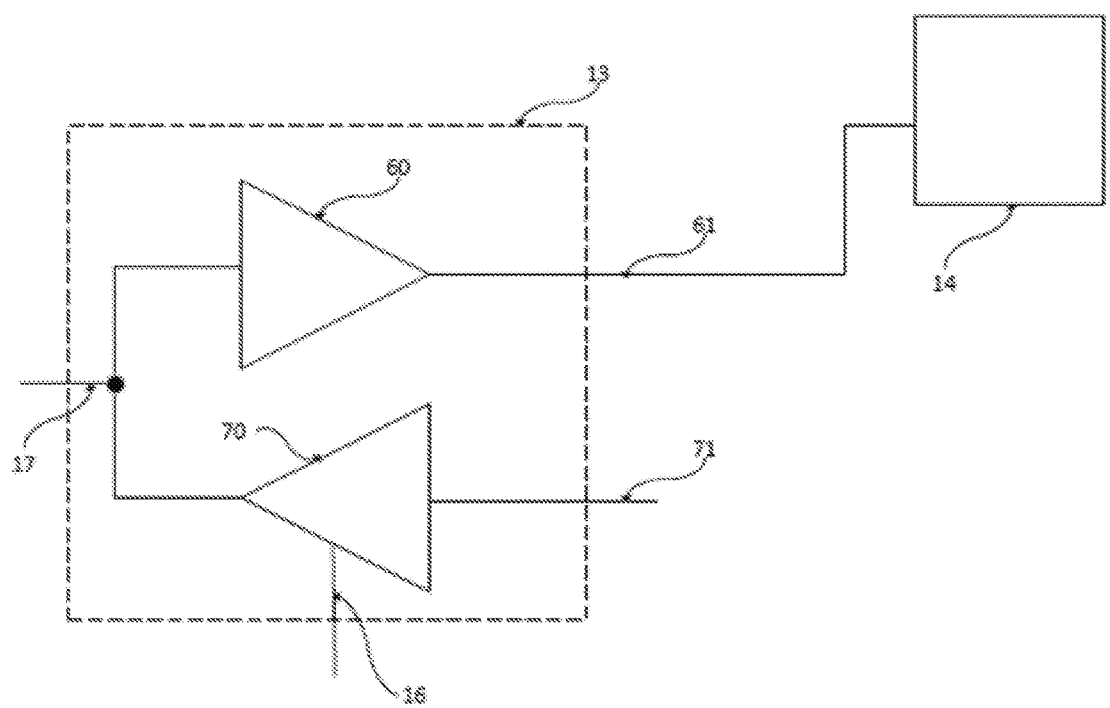
FIG. 3 is a schematic view of an IO driver comprising a receive register.

FIG. 3 shows a driver 13 that is implemented on the second interface pin 8. A receive register 14 is implemented in the second FPGA 2 and is connected to the read driver 60. The signal 17 applied to the second interface pin 8 is evaluated by the read driver 60 and written into the receive register 14 as a logical value 61. Receive registers 14 can of course be implemented on each IO driver 13 and therefore on each interface pin 3, 4, 5, 6, 7, 8, 9, 10, 50, 51, 52.

Figure 4:
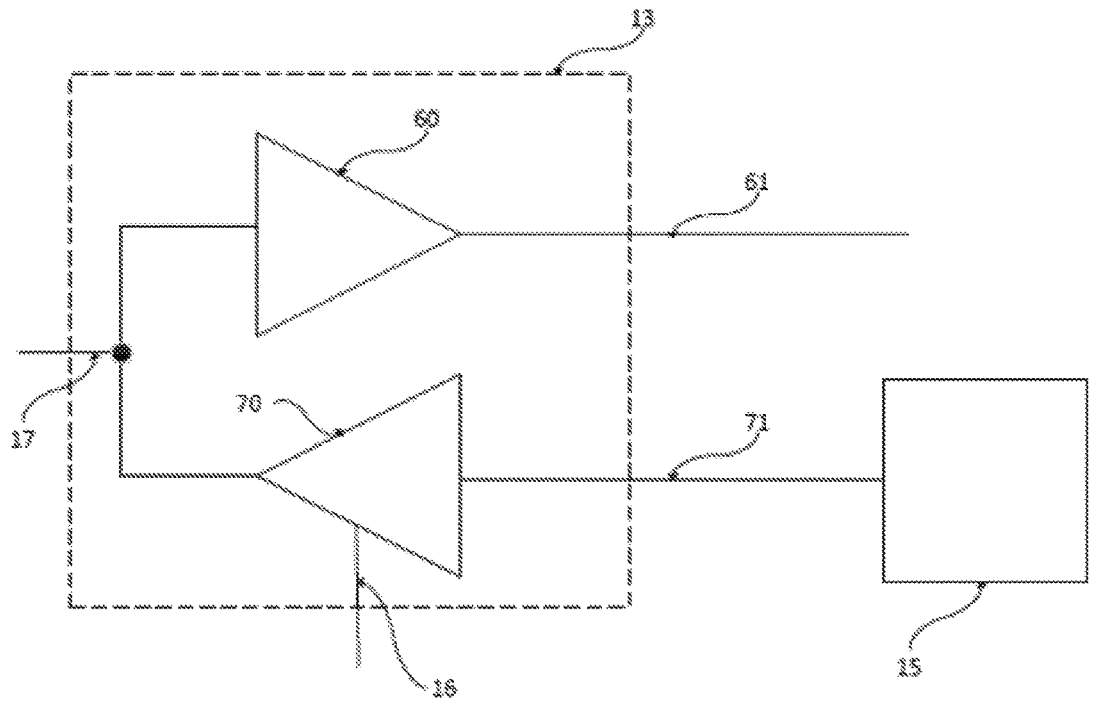
FIG. 4 is a schematic view of an IO driver comprising a send register.

FIG. 4 shows a driver 13 that is implemented on the first interface pin 5. A send register 15 is connected to the write driver 70. If the activation signal 16 activates the write driver 70, the write driver 70 transforms the logical value 71 from the send register 15 into a signal 17 that is to be output via the first interface pin 5. The send registers 15 can of course be implemented on each IO driver 13.

The receive register 14 and the send register 15 can be set or read out using various known techniques.

FIG. 5 shows a method that can be carried out using the FPGAs shown in FIG. 2. In this figure, the receive register 14 shown in FIG. 3 is implemented on the second interface pin 8 of the second FPGA 2 in a first step 110. In a second step 120, the send register 15 shown in FIG. 4 is implemented on the first interface pin 5 of the first FPGA 1. In a third step 130, the send register 15 is set. In a fourth step 140, the activation signal 16 is set and the write driver 70 on the first interface pin 5 is therefore activated. In a fifth step 150, the receive register 14 is read out. If the value 71 set into the send register 15 in the third step 130 has been read out from the receive register 14 in the fifth step 150, the interface pins 5, 8 are allocated to one another in a sixth step 160. The allocation is then stored or output to the user in a seventh step 170. If the value 71 set into the send register 15 in the third step 130 has not been read out from the receive register 14 in the fifth step 150, the method is terminated or issues a message that allocation could not be carried out.

If a plurality of receive registers 14 and/or send registers 15 are implemented on one driver 13 in each case, a plurality of lines 11, 12 can be tested. In this case, steps four to seven are repeated. The activation signal 16 is only set for an individual write driver 70 in the fourth step 140 in each case. In the fifth step 150, all the receive registers 14 are read out. In the sixth step 160, all the interface pins 3, 4, 5, 6, 7, 8, 9, 10, 50, 51, 52, from the receive registers 14 of which the value 71 set in the third step 130 has been read out in the fifth step 150, are allocated to the interface pin 3, 4, 5, 6, 7, 8, 9, 10, 50, 51, 52 comprising the driver 13 that is active in each case. The allocation is then stored or output to the user in a seventh step 170. Steps four to seven are repeated until each of the write drivers 70 has been active once.

Figure 6:
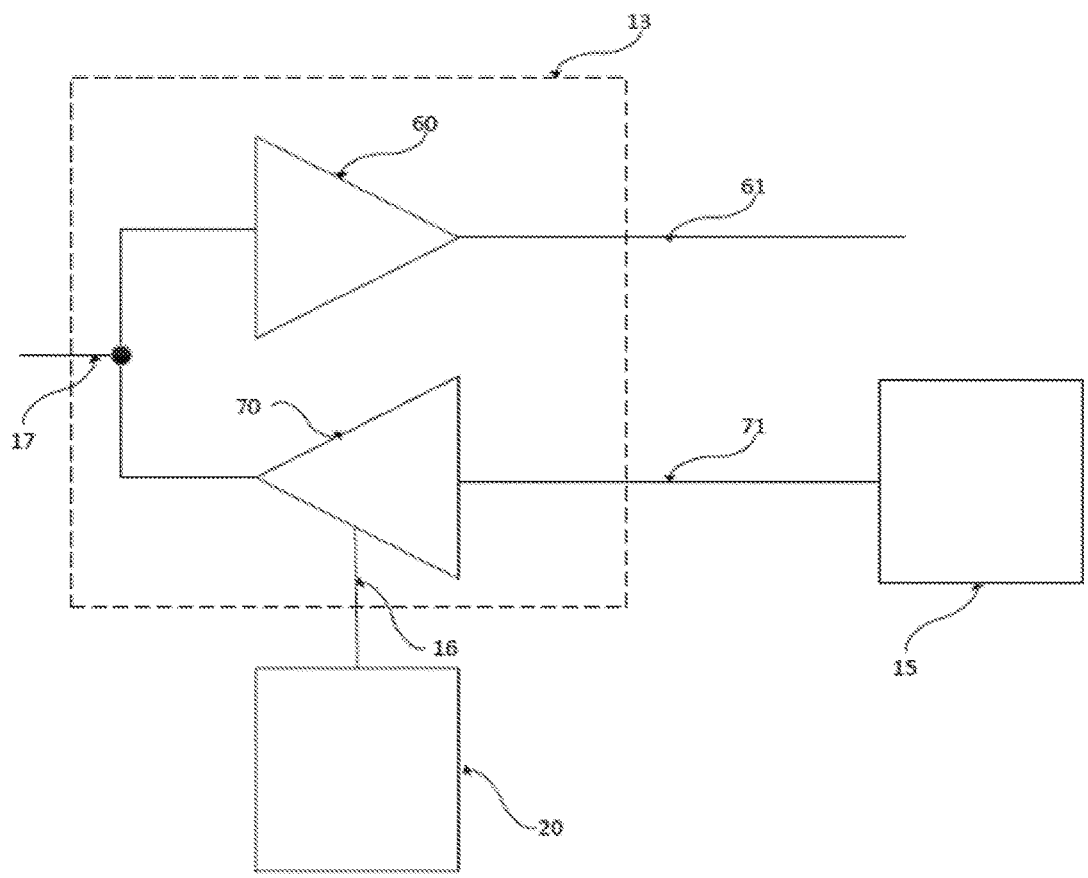
FIG. 6 is a schematic view of an IO driver comprising a send register and an activation register.

FIG. 6 shows an alternative driver 13 implemented on the first interface pin 5. In contrast to FIG. 4, an activation register 20 is implemented in the first FPGA 1. The activation register 20 contains the activation signal 16 for the write driver 70. In this embodiment, the write driver 70 can be activated by setting the activation register 20.

Figure 7:
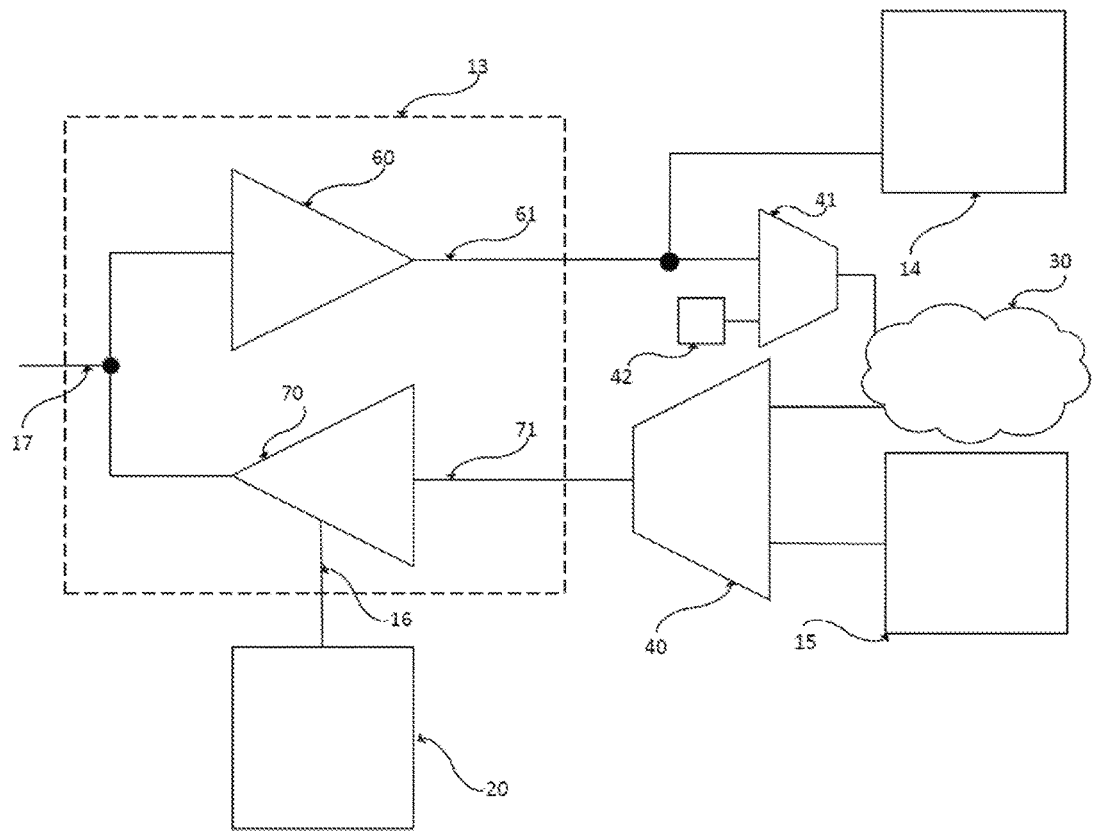
FIG. 7 is a schematic view of an IO driver comprising a receive register, a send register, an activation register and an FPGA program.

FIG. 7 shows the implementation of the receive register 14 and the send register 15, together with an FPGA program 30, on an IO driver 13. A send multiplexer 40 is implemented on the FPGA 1, 2, 80. The send multiplexer 40 either connects the send register 15 to the write driver 70 or connects the FPGA program 30 to the write driver 70. In order to test the connections, the send register 15 is first connected to the write driver via the send multiplexer 40. Once the test procedure for all the drivers connected to a send register has finished, the send multiplexers 40 are switched over and the FPGA program 30 is connected to the write drivers. In addition, a receive multiplexer 41 and a constant 42 are implemented on the FPGA. The receive multiplexer either connects the constant 42 to the FPGA program or forwards the signal 61 provided by the read driver 60 to the FPGA program. The receive register is rigidly connected to the driver and receives the signal provided by the read driver. In order to test the connection, the FPGA program 30 is connected to the constant 42. Once the test procedure has finished, the receive multiplexer 41 is switched over and the read driver 60 is connected to the FPGA program 30. If the receive multiplexer 41 connects the FPGA program 30 to the driver 13, it is possible to use the value 61 provided by the read driver 60 in the FPGA program and to read it out via the receive register 14. The receive register and the receive multiplexer can of course be implemented, together with an FPGA program, on a plurality of interface pins of an FPGA.

Figure 8:
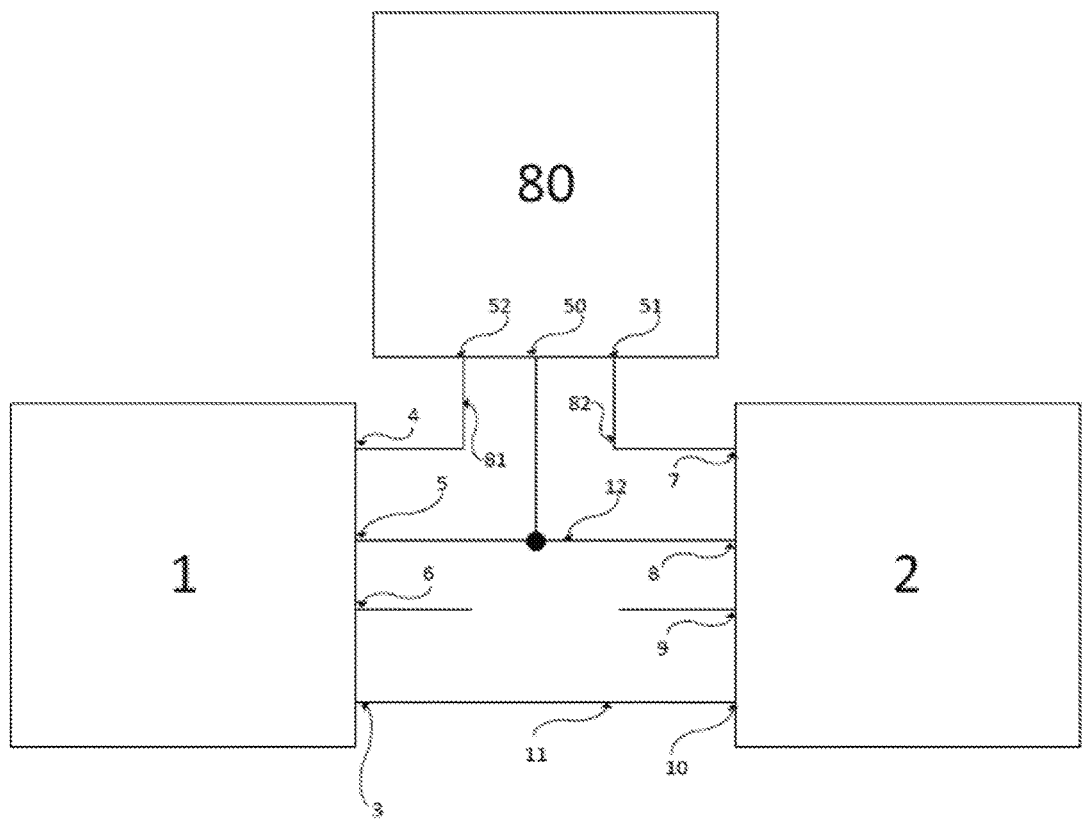
FIG. 8 is a schematic view of three FPGAs, which are interconnected via a plurality of lines.

FIG. 8 is a schematic view of three FPGAs, which are interconnected via a plurality of lines 11, 12, 81, 82. A second line 81 connects an interface pin 4 of the first FPGA 1 to an interface pin 52 of the third FPGA 80 and a third line 82 connects an interface pin 7 of the second FPGA 2 to an interface pin 51 of the third FPGA 80. A fourth line 11 connects an interface pin 3 of the first FPGA 1 to an interface pin 10 of the second FPGA 2. In this example, the first line 12 connects the first interface pin 5 of the first FPGA 1 to the second interface pin 8 of the second FPGA 2 and to a third interface pin 50 of the third FPGA 80. These connections are, of course, only examples. In principle, every interface pin can be connected to every other interface pin. If send and receive registers 14, 15 are implemented on all the interface pins, all the lines 11, 12, 81, 82 can be tested and the entire wiring topology can be created. If send and/or receive registers 14, 15 are only implemented on some of the interface pins, only a partial wiring topology can be created.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for detecting the topology of electrical wiring between at least two field-programmable gate arrays (FPGAs), wherein a first FPGA comprises a plurality of interface pins including a first interface pin, wherein a second FPGA comprises a plurality of interface pins including a second interface pin, wherein a plurality of lines connect at least some of the interface pins of the first FPGA to at least some of the interface pins of the second FPGA, wherein a first driver is provided on the first interface pin, wherein the method comprises:
 implementing a first receive register on the second interface pin;
 implementing a first send register on the first driver;
 activating the first driver via a first activation signal;
 emitting, by the first driver, a first signal, wherein the first signal is defined by the first send register;
 reading out, by the first receive register, whether the first signal is received at the second interface pin; and
 allocating the second interface pin to the first interface pin if the first signal from the first driver is received at the second interface pin;
 wherein a second receive register is implemented on a third interface pin, the second receive register reading out whether the first signal is received at the third interface pin, the third interface pin being allocated to the first interface pin if the first signal is received at the third interface pin.

2. The method according to claim 1, wherein a first activation register is implemented on the first driver, the first activation register transmitting the first activation signal to the first driver.

3. The method according to claim 1, wherein the first activation signal is directly transmitted to the first driver via a control body.

4. The method according to claim 1, wherein the first receive register and the first send register are addressed via a control body.

5. The method according to claim 1, wherein a warning is issued if the first signal is not received at the second interface pin.

6. The method according to claim 1, wherein a plurality of activation signals are implemented for a plurality of drivers, each of the activation signals individually activating a respective driver and all the interface pins at which the signal from the respective driver, which is active in each case, is received being allocated to the interface pin of the active driver.

7. The method according to claim 1, wherein first information relating to a first FPGA program determines for which interface pins of the first FPGA activation signals, send registers and/or receive registers are implemented.

8. The method according to claim 7, wherein the first FPGA program is implemented, together with the first send register, on the first FPGA, a first send multiplexer being implemented on the first FPGA, the first send multiplexer connecting the first driver to the first send register and to the first FPGA program, the first send multiplexer controlling whether the first send register or the first FPGA program defines the signal to be issued by the first driver.

9. The method according to claim 1, wherein second information relating to a second FPGA program determines for which interface pins of the second FPGA activation signals, send registers and/or receive registers are implemented.

10. The method according to claim 9, wherein the second FPGA program is implemented, together with a second send register, on the second FPGA, a second send multiplexer being implemented on the second FPGA, the second send multiplexer connecting a second driver to the second send register and to the second FPGA program, the second send multiplexer controlling whether the second send register or the second FPGA program defines the signal to be issued by the second driver.

11. The method according to claim 1, wherein a second activation signal is implemented on the second interface pin, a warning being issued if the first signal is received at the second interface pin.

12. The method according to claim 1, wherein an activation signal, a send register and a receive register are implemented on each of the interface pins.

13. The method according to claim 12, wherein the entire wiring topology is determined.

14. The method according to claim 1, wherein an activation register is implemented for the first activation signal.

* * * * *